(12) United States Patent
van de Rijdt

(10) Patent No.: US 9,193,015 B2
(45) Date of Patent: Nov. 24, 2015

(54) METHODS FOR COMPONENT PLACEMENT UTILIZING A COUNTERACTING FORCE DRIVE

(71) Applicant: Assembléon B.V., Veldhoven (NL)

(72) Inventor: Johannes Hubertus Antonius van de Rijdt, Gemert (NL)

(73) Assignee: ASSEMBLEON B.V., La Veldhoven (NL)

(*) Notice: Subject to any disclaimer, the term of this patent is extended or adjusted under 35 U.S.C. 154(b) by 274 days.

(21) Appl. No.: 13/673,943

(22) Filed: Nov. 9, 2012

(65) Prior Publication Data

US 2013/0117989 A1    May 16, 2013

(30) Foreign Application Priority Data

Nov. 11, 2011    (NL) .................................... 2007777

(51) Int. Cl.
| | | |
|---|---|---|
| B23P 19/02 | (2006.01) | |
| B23P 11/00 | (2006.01) | |
| H05K 13/04 | (2006.01) | |

(52) U.S. Cl.
CPC ............ B23P 11/00 (2013.01); H05K 13/0404 (2013.01); H05K 13/0452 (2013.01); *Y10T 29/49826* (2015.01); *Y10T 29/53* (2015.01)

(58) Field of Classification Search
CPC ........................... H05K 13/0413; B23P 19/04
USPC ............ 29/740–743, 714, 720, 836; 414/737, 414/752.1–752.2
See application file for complete search history.

(56) References Cited

U.S. PATENT DOCUMENTS

| | | | | |
|---|---|---|---|---|
| 5,778,525 A | * | 7/1998 | Hata et al. ........................ | 29/836 |
| 6,971,157 B1 | * | 12/2005 | Yoshida et al. .................. | 29/739 |
| 7,159,305 B2 | * | 1/2007 | Aoki et al. ........................ | 29/720 |
| 7,353,589 B2 | * | 4/2008 | Kawasumi et al. ............. | 29/740 |
| 7,797,819 B2 | * | 9/2010 | Kawasumi et al. ............. | 29/740 |

(Continued)

FOREIGN PATENT DOCUMENTS

| | | |
|---|---|---|
| EP | 1 937 050 | 6/2008 |
| JP | 2011-187468 | 9/2011 |

(Continued)

OTHER PUBLICATIONS

Search Report for the priority Dutch Application No. 2007777 with Written Opinion in English, received on Sep. 12, 2012.

*Primary Examiner* — Minh Trinh
(74) *Attorney, Agent, or Firm* — Ladas & Parry, LLP

(57) ABSTRACT

A method for driving a component placement device, the component placement device having a machine frame, component pickup units and a subframe, the first and second component pickup units configured to be movable in a direction of travel, the method comprising: moving at least one of the component pickup unit in the direction of movement relative to the subframe, the component pickup units and the subframe configured for a reactive force to be exerted on the subframe by the moving of the at least one of the component pickup units; determining a counterforce to be exerted against the subframe substantially opposite a direction of the reactive force, the counterforce determined by an auxiliary control unit, wherein the counterforce at least partially counteracts the reactive force; and applying the counterforce to the subframe substantially in the opposite direction of the reactive force by at least one drive unit.

5 Claims, 9 Drawing Sheets

(56) References Cited

U.S. PATENT DOCUMENTS 7,854,061 B2 * 12/2010 Kimura .......................... 29/739
2009/0217514 A1    9/2009 Kimura

FOREIGN PATENT DOCUMENTS

| WO | 99/44407 | 9/1999 |
| WO | 00/40069 | 7/2000 |

* cited by examiner

METHODS FOR COMPONENT PLACEMENT UTILIZING A COUNTERACTING FORCE DRIVE

CROSS-REFERENCE TO RELATED APPLICATIONS

This application claims priority to Dutch Patent Application No. 2007777 filed on Nov. 11, 2011, the disclosure of which is hereby incorporated by reference in its entirety.

BACKGROUND

A component placement device is described in applicant's European patent application EP 1 937 050 A1.

In said known described placement device, the machine frame supports a number of subframes. Each subframe is provided with a guide, over which a component pickup unit is movable in a direction of movement parallel to the guide. Each component pickup unit is further movable relative to the subframe in a direction transversely to the direction of movement. The guides extend parallel to each other. Disposed under the component pickup units is a conveying device that extends transversely to the direction of movement for transporting substrates. Each subframe at least comprises a motor for moving the component pickup unit in the direction of movement. Components are picked up from component pickup positions by means of the component pickup unit, after which the component pickup unit is moved to a position above a desired position on the substrate, whereupon the component is placed on the desired position on the substrate.

SUMMARY

The invention relates to a component placement device comprising a machine frame and at least two component pickup units which are movable relative to at least one subframe supported by a machine frame, each component pickup unit being movable at least in a direction of movement.

The placement of such components must take place with the highest possible speed and accuracy.

To attain such a high speed, the component pickup unit is moved from the pickup position with a relatively high acceleration. In a similar manner, the component pickup unit must be quickly decelerated near the desired position on the substrate or, in other words, be moved with a relatively high negative acceleration. Such high accelerations also occur upon returning to the pickup position. Because of said accelerations, relatively large reactive forces are exerted on the subframe by the component pickup unit. Said reactive forces cause among other things, vibrations and deformations of the machine frame and other subframes supported by the machine frame, thus affecting the accuracy with which another component pickup unit can be moved to a desired position. This effect is called dynamic crosstalk, which term is understood to mean the influence of the dynamic behaviour of one component pickup unit on the positioning accuracy of another component pickup unit.

In order to reduce the influence of such reactive forces, it is possible to move the component pickup unit with less high accelerations. However, this will have an adverse effect on the number of components that can be moved per unit time.

Another possibility is to make the machine frame much heavier and stiffer, so that the reactive forces can be better absorbed. This will make the component placement device relatively costly to produce and use, however.

The object of the invention is to provide a component placement device and a method for controlling such a component placement device, wherein reactive forces exerted by one component placement unit will have practically no effect on the positioning accuracy of another component pickup unit.

This object is accomplished with the component placement unit according to the invention in that, the component placement device comprises means for determining the magnitude of a counterforce to be exerted on the subframe substantially in the direction of movement, as well as at least one drive unit for exerting the counterforce determined by said means substantially in the direction of movement on the subframe for the purpose of at least partially counteracting the reactive force exerted on the subframe by at least one component pickup unit during movement of the component pickup unit in the direction of movement relative to the subframe.

By actively and purposefully exerting a counterforce in the direction of movement, which direction is the opposite of the direction of the reactive force and which is preferably of the same magnitude as the reactive force, the reactive force exerted on the subframe is at least partially (and preferably substantially entirely) withstood, making it possible to prevent the occurrence of vibrations and deformations of, inter alia, the machine frame, and the transmission thereof to other subframes near the origin of the source, being the subframe, at least substantially and preferably practically entirely. As a result, the dynamic crosstalk is significantly reduced or at least practically entirely prevented. The magnitude of the counterforce to be exerted is determined either by calculation or by measurement.

One embodiment of the component placement device according to the invention is characterised in that the subframe is provided with a first part of the drive unit, whilst a second part of the drive unit, which cooperates with the first part of the drive unit, is mounted on an auxiliary frame that is freestanding from the machine frame.

The term "freestanding auxiliary frame" is understood to mean any support for a drive unit that is capable of suppressing or eliminating forces from the machine frame and from subframes supported by the machine frame, so that there will be fewer vibrations, if any.

Such an auxiliary frame can be formed by a wall of the building in which the component placement device is installed. Such an auxiliary frame may also be a metal construction, for example, which is disposed near the machine frame. As a result, the second part of the drive unit that is supported by the auxiliary frame will not experience any effect of the reactive force exerted on the associated subframe by the component pickup unit during movement of the component pickup unit in the direction of movement, and the force exerted on the first part by the second part can be fully utilised for counteracting the reactive force.

Another embodiment of the component placement device according to the invention is characterised in that the first part comprises at least one permanent magnet, whilst the second part comprises at least one electrically energisable coil, or vice versa.

Using a permanent magnet and an electrically energisable coil that cooperates therewith, it is possible to easily generate counterforces that vary in magnitude and in time.

Yet another embodiment of the component placement device according to the invention is characterised in that the component placement device comprises a control unit for delivering a control signal for controlling the movement of the component pickup unit in the direction of movement, wherein the drive unit is provided with means for determining the magnitude of the counterforce to be exerted by the drive unit in dependence on the control signal.

Such a control signal usually comprises information on the desired movement pattern in time, for example the movement during the time that is needed for moving the component placement unit from a component pickup position to the desired position above the substrate. The movement pattern comprises three phases, for example, a first acceleration phase, a second phase with a constant high-speed and a third braking phase with a negative acceleration. During the first and the third phases, the drive unit generates a force that depends on the accelerations (decelerations) that occur and the moving mass.

Yet another embodiment of the component placement device according to the invention is characterised in that the component placement device is provided with a force sensor for determining the reactive force exerted on the subframe by the moving component pickup unit, wherein the drive unit is provided with means for determining the magnitude of the counterforce to be exerted by the drive unit in dependence on the reactive force exerted on the subframe in question and measured by the force sensor.

In this way the reactive force that occurs is measured directly and the counterforce to be exerted by the drive unit is directly known therefrom.

The object of the invention is achieved with the method according to the invention in that in the method for driving a component placement device comprising a machine frame and at least two component pickup units which are movable relative to at least one subframe supported by a machine frame, each component pickup unit being movable at least in a direction of movement, at least one component pickup unit is moved in the direction of movement relative to the subframe, with a reactive force being exerted on the subframe by the component pickup unit, that a counterforce to be exerted substantially in the direction of movement on the subframe is determined by means for the purpose of at least partially counteracting the reactive force, whereupon the counterforce determined by said means is exerted substantially in the direction of movement on the subframe by means of at least one drive unit.

Each time the component pickup unit is moved relative to the subframe, thereby exerting a reactive force on the subframe, the drive unit will exert a counterforce on the subframe.

Another embodiment of the method according to the invention is characterised in that the magnitude of the counterforce to be exerted is determined at least on the basis of a control signal for controlling the movement of the component pickup unit in the direction of movement.

From said control signal, the accelerations (decelerations) that occur can be determined, and in combination with the known weight of the moving parts, it is possible to determine therefrom the forces that will occur, and consequently the required counterforces.

Yet another embodiment of the method according to the invention is characterised in that the reactive force exerted on the subframe by the moving component pickup unit is measured by means of a force sensor, whereupon the magnitude of the counterforce to be exerted is determined at least in dependence on the reactive force being exerted on the subframe and measured by the force sensor.

Using the force sensor, the reactive force that occurs, and consequently the required counterforce, is directly determined.

BRIEF DESCRIPTION OF THE DRAWINGS

The invention will be explained in more detail with reference to the drawing, in which.

DETAILED DESCRIPTION

Figure 1:
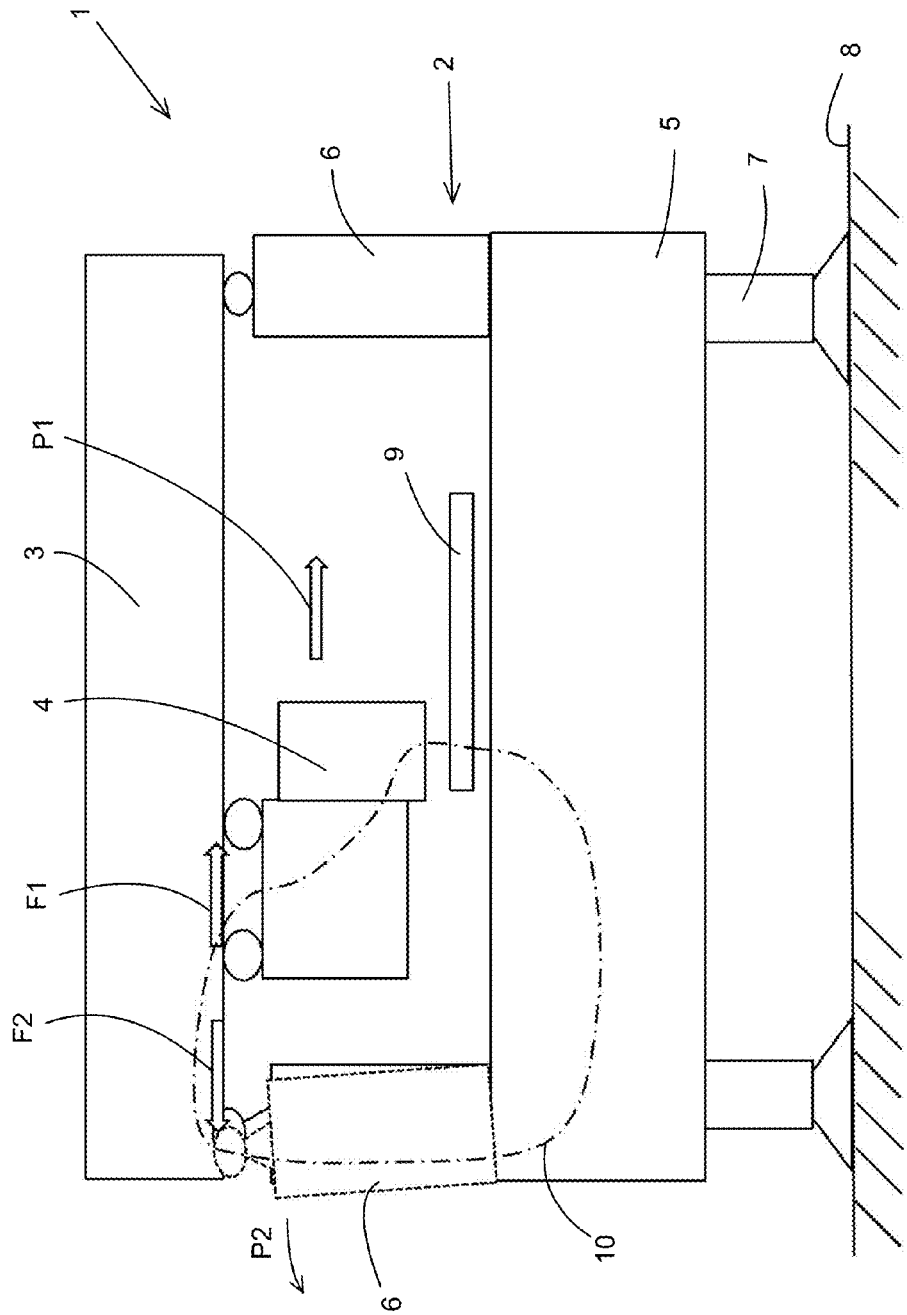
FIG. 1 is a schematic side view of a component placement device according to the prior art.

FIG. 1 shows a schematic side view of a component placement device 1 according to the prior art, which comprises a machine frame 2, a subframe 3 supported by the machine frame 2 and a component pickup unit 4 which is movable relative to the subframe 3. The component pickup unit 4 is movable at least in a direction of movement indicated by arrow P1 and in the opposite direction. The machine frame 2 comprises a support part 5 and upright parts 6 disposed on either side of the support part 5. The support part 5 is supported on a base 8 via support legs 7. Supported on the support part 5, between the upright parts 6, is a conveying device (not shown) for conveying substrates 9 in a direction transversely to the plane of the drawing. The component pickup unit 4 is movable in a usual manner, as for example known from EP 1 937 050 A1, from a component pickup position (not shown) to a desired position above the substrate 9 for picking up, moving and subsequently positioning the picked-up component on the substrate 9. The movement of the component pickup unit 4 relative to the subframe 3 takes place by means of a motor which is controlled by a control unit for moving the component pickup unit 4 with the desired accelerations and at the desired speeds. Upon acceleration of the component pickup unit 4 in the direction indicated by arrow P1, the motor exerts a force F1 in the direction indicated by arrow P1 on the component pickup unit 4. This results in a reactive force F2 of the component pickup unit 4 on the subframe 3, which reactive force F2 is equal in magnitude to the force F1 but opposite in direction thereto. Said reactive force F2 is exerted on the upright part 6 via the subframe 3, as a result of which the upright part 6 will bend elastically in the direction indicated by arrow P2. The bent shape is illustrated in dotted lines. The degree of bending is shown on an enlarged scale for the sake of clarity. The deformation of the part 6 causes the subframe 3 to move in the opposite direction of arrow P1. The varying reactive forces F2 will cause vibrations. Once the reactive force F2 decreases, the part 6 will bend back. Because the reactive force F2 will decrease to zero when the component pickup unit 4 is stopped for picking up or placing a component, the vibrations will dampen out and the vibrations and movements in the machine frame caused by the reactive force F2 will have practically no effect on the accuracy during placement of the component by means of the stationary component pickup unit 4.

If, however, a second subframe 3 is present on the machine frame 2 next to the first subframe 3, which second subframe 3 is also provided with a second component pickup unit 4 that is movable relative to the second subframe 3, the deformations and vibrations in the machine frame 2 caused by the reactive force F2 will interfere with an accurate placement of a component by means of said second component pickup unit 4, since said deformations and vibrations affect, via the loop 10 (illustrated in dotted lines), the relative positions of the parts present in the loop 10. As a result, accurate placement of a component by means of the component pickup unit 4 of the second subframe with a degree of accuracy of less than 15 micron or less is not possible. It also stands to reason that the reactive forces that occur during movement of the component pickup unit 4 over the second subframe will have a negative effect on the placement accuracy of the component pickup unit 4 of the first subframe.

Figure 2:
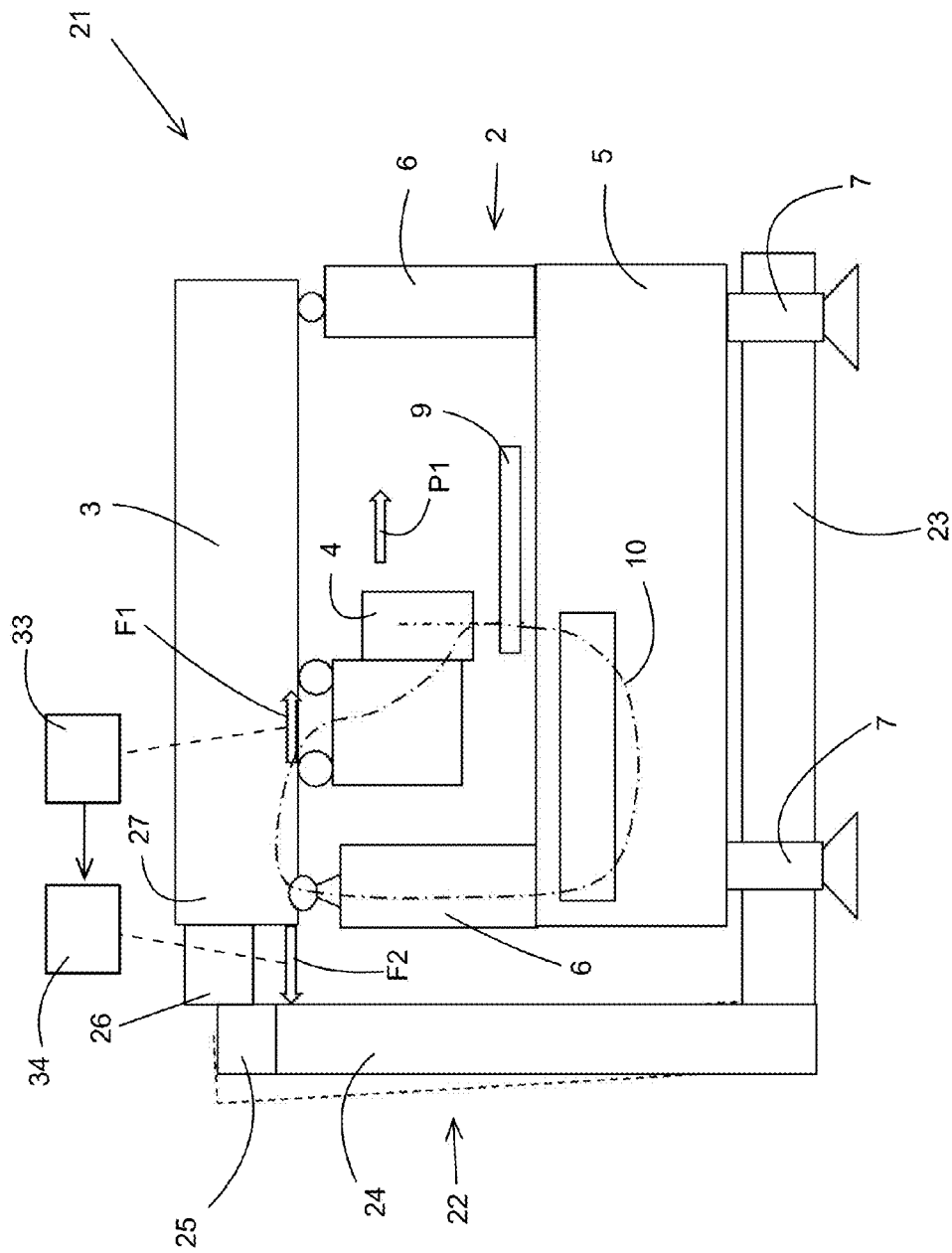
FIG. 2 is a schematic side view of a component placement device according to the invention.

FIG. 2 is a schematic side view of a component placement device 21 according to the invention, which is different from the component placement device 1 shown in FIG. 1 in that it comprises an auxiliary frame 22 in addition to a machine frame 2, a subframe 3, a component pickup unit 4, a support part 5 and parts 6. The auxiliary frame 22 comprises sections 23 positioned under the support part 5, which are supported on the support legs 7 of the machine frame 2. The auxiliary frame 22 further comprises uprights 24 extending parallel to the parts 6 and a girder 25 disposed between ends of the uprights 24. Since the connection between the machine frame 2 and the auxiliary frame 22 is spaced from the loop 10 by a relatively large distance, forces that occur near the component pickup unit 4 are not noticeably transmitted to the auxiliary frame 22, and vice versa. The auxiliary frame 22 is made of a metal, for example.

Figure 3:
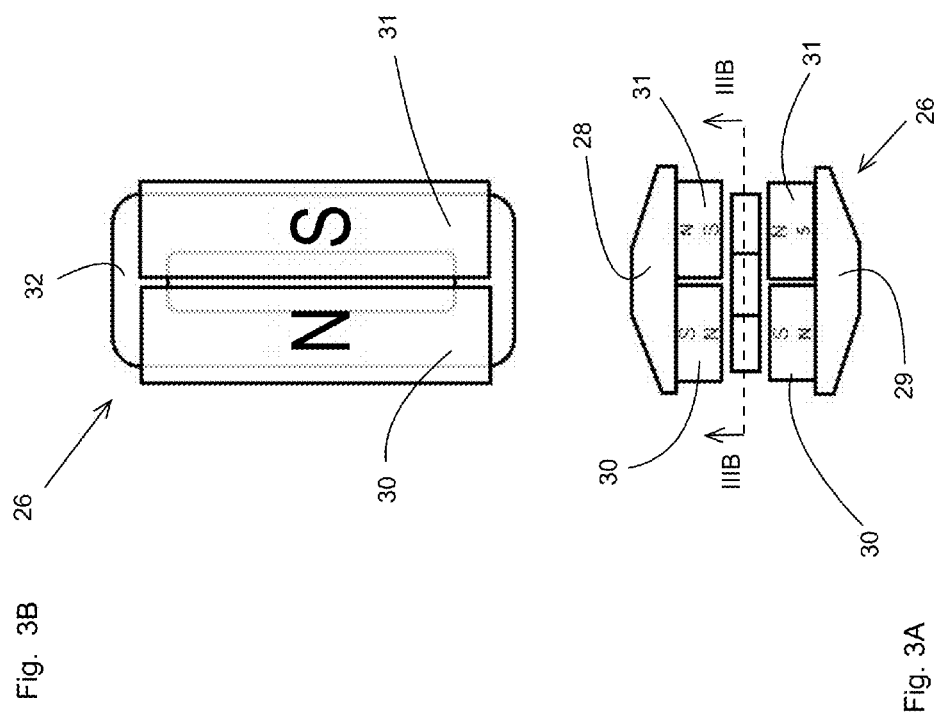
FIGS. 3A and 3B are a top plan view and a view in the direction indicated by arrows IIIB-IIIB, respectively, of a drive unit of the component placement device shown in FIG. 2.
Figure 4:
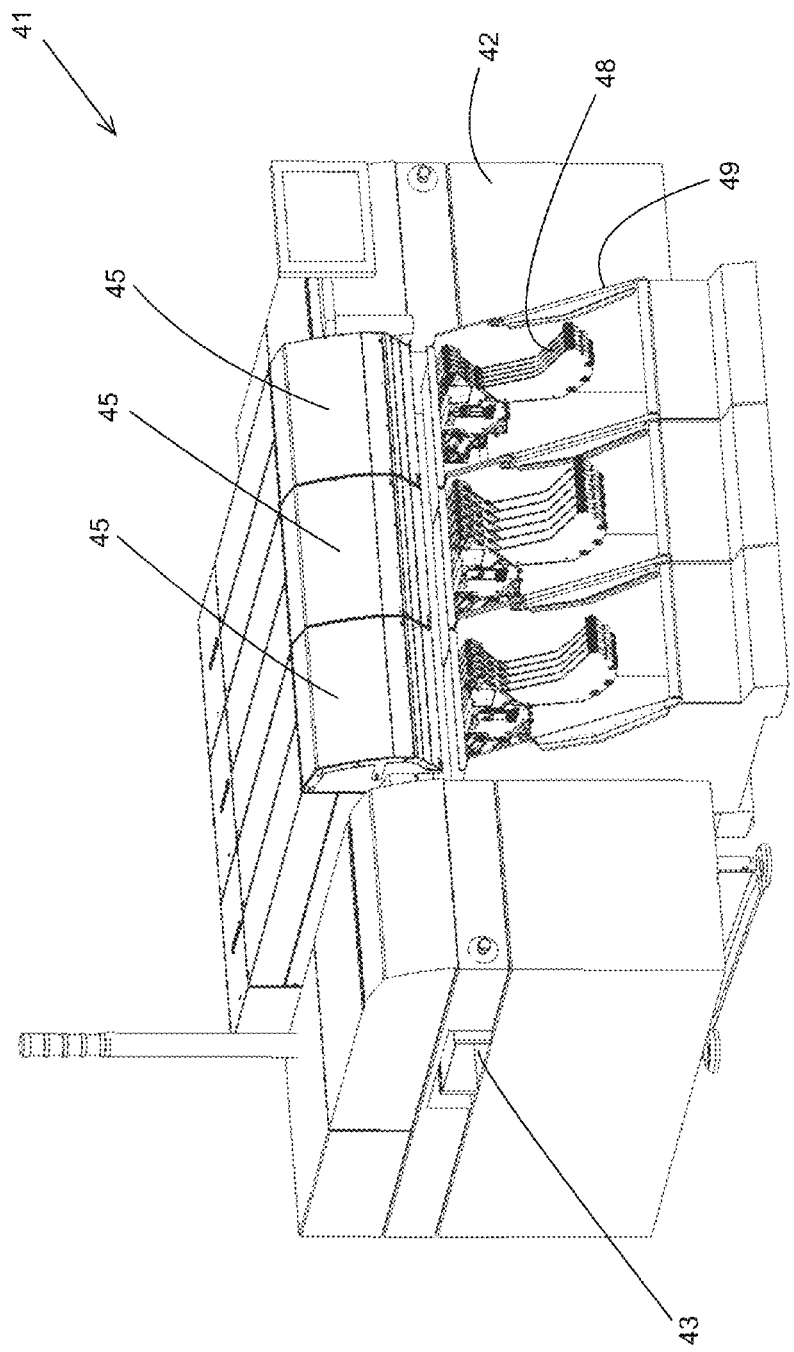
FIG. 4 is a perspective front view of an embodiment of a component placement device according to the invention.
Figure 5:
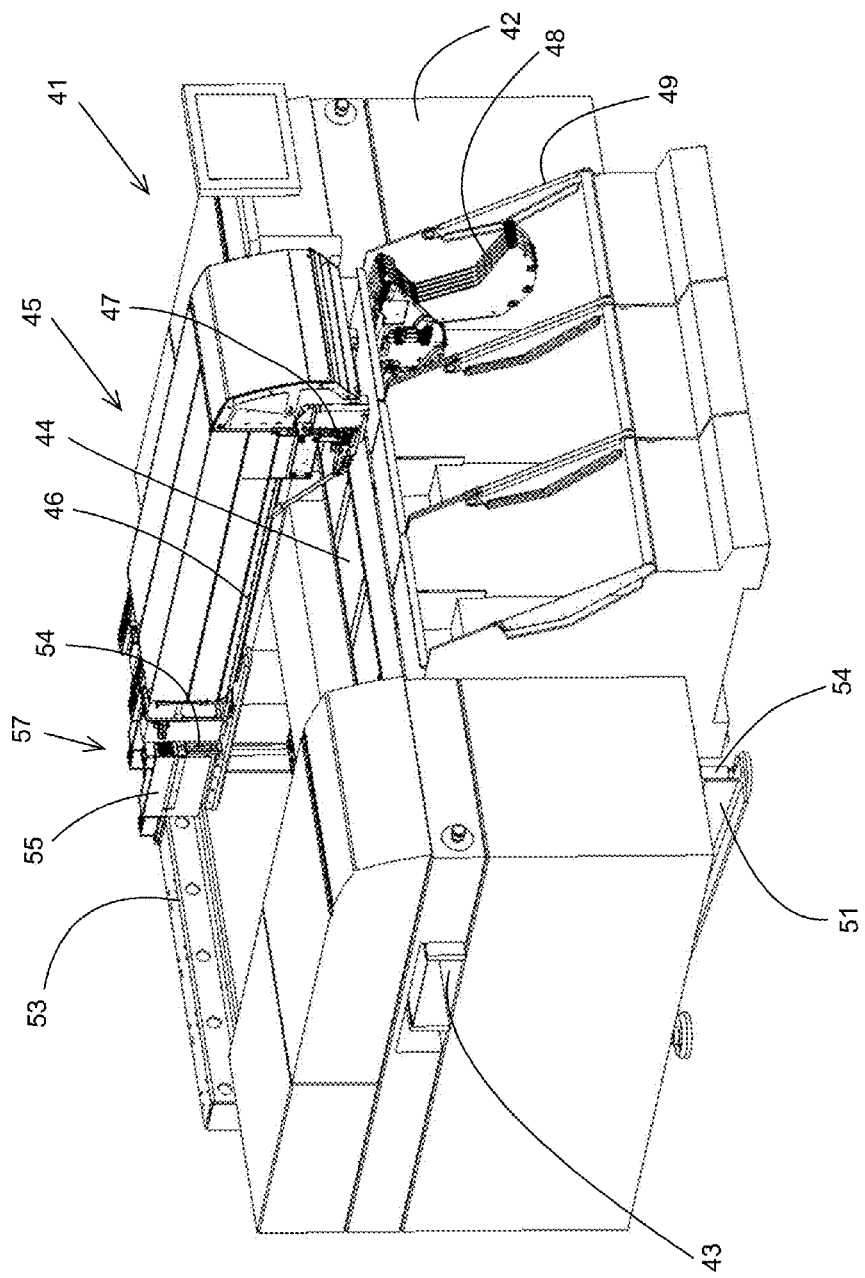
FIG. 5 is a perspective, partially cutaway front view of the component placement device shown in FIG. 3.
Figure 6:
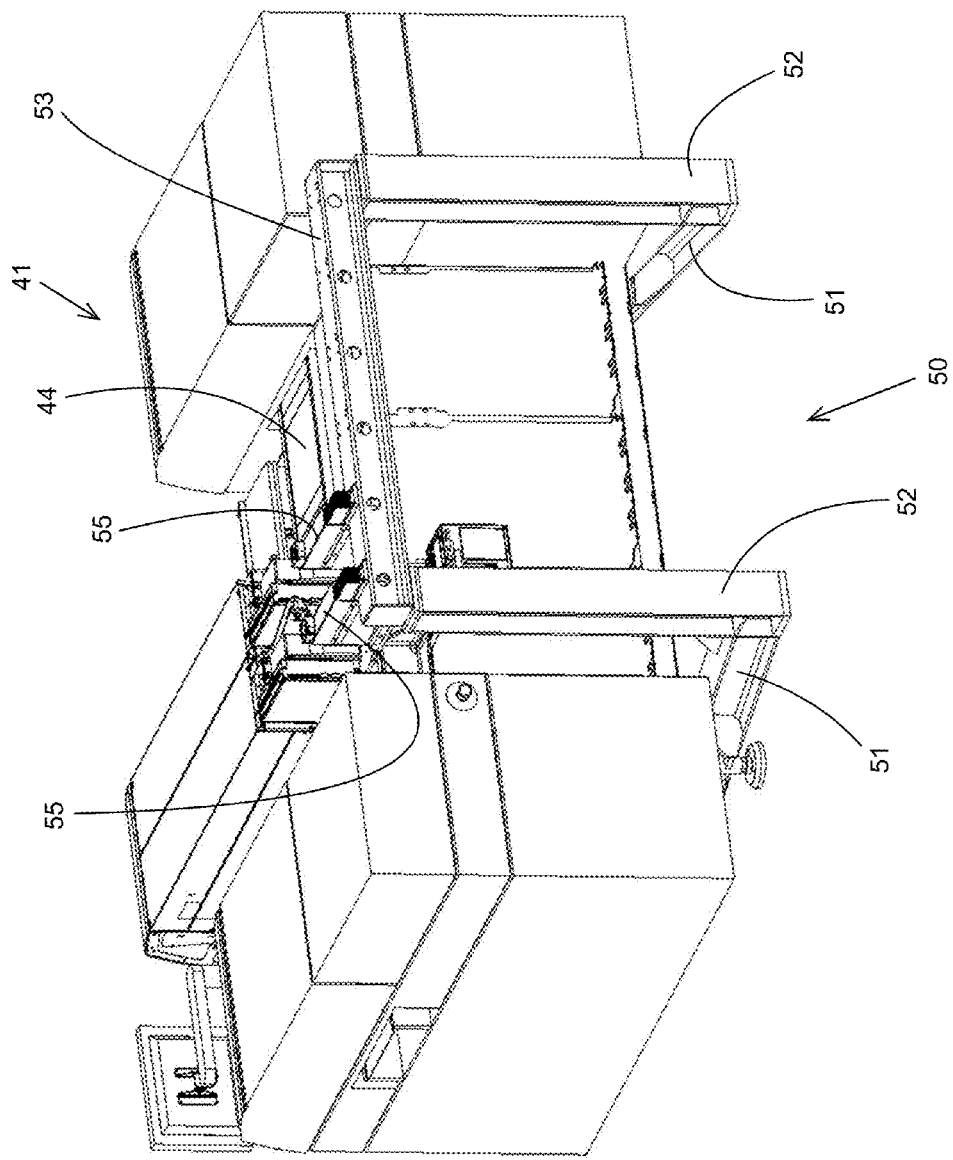
FIG. 6 is a perspective, partially cutaway rear view of the component placement device shown in FIG. 3.
Figure 7:
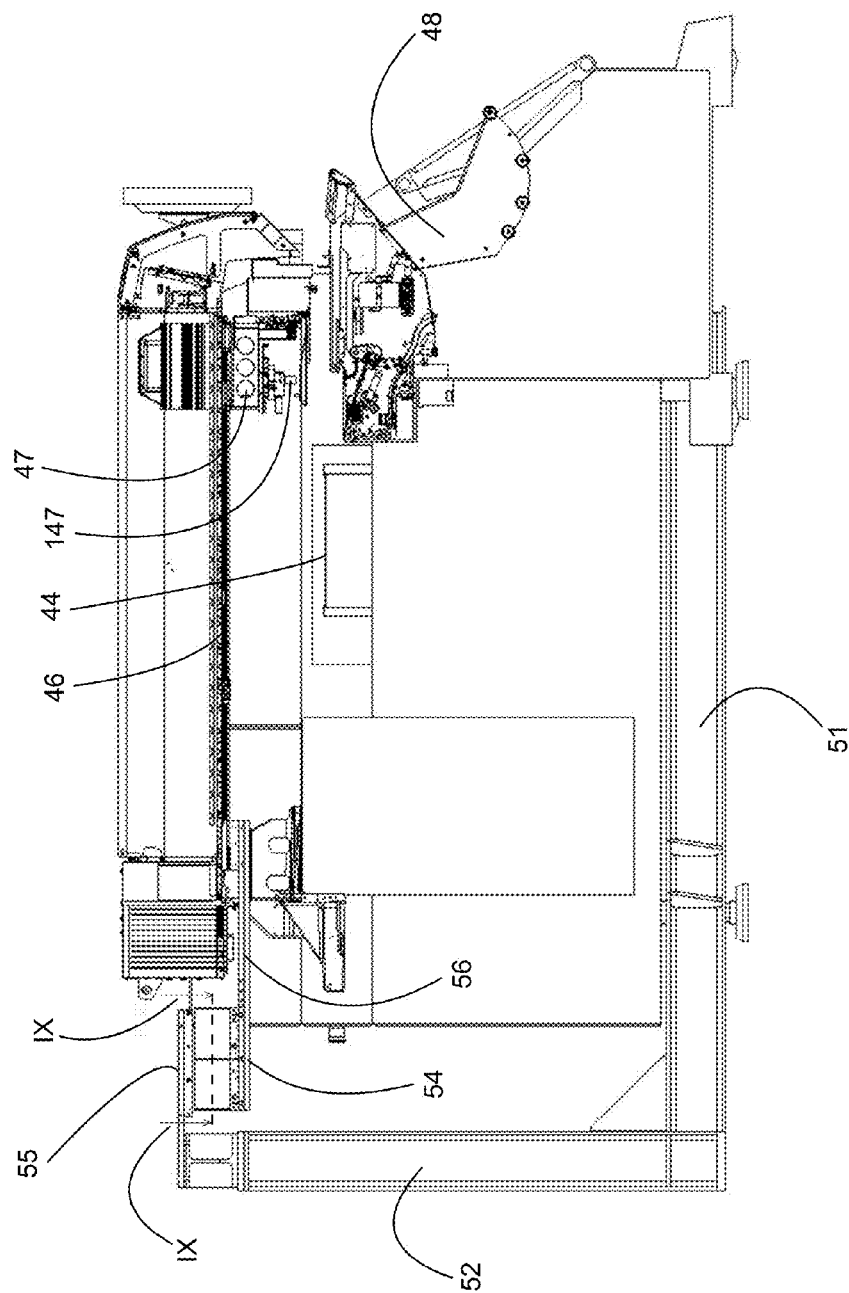
FIG. 7 is a partially cutaway side view of the component placement device shown in FIG. 3.

The component placement device 21 is further provided with a drive unit 26, which is shown on a larger scale in FIGS. 3A and 3B. The drive unit 26 comprises a first part connected to the end 27 of the subframe 3, which comprises two spaced-apart blocks 28, 29 provided with permanent magnets 30, 31. The magnets 30 of the blocks 28, 29 are positioned opposite each other and have the same polarization. The magnets 31 of the blocks 28, 29 are positioned opposite each other and have the same polarization but which is the opposite of that of the magnets 30. The polarisation directions extend in a direction parallel to the conveying direction of the substrate 9. The drive unit 26 further comprises a second part, which is provided with an electrically energisable coil 32 that is connected to the girder 25, a left-hand part of which is disposed between the magnets 30 and a right-hand part of which is disposed between the magnets 31.

The movement of the component pickup unit 4 relative to the subframe 3 takes place by means of a motor which is controlled by a control unit 33 for moving the component pickup unit 4 with the desired accelerations and at the desired speeds. Upon acceleration of the component pickup unit 4 in the direction indicated by arrow P1, the motor exerts a force F1 in the direction indicated by arrow P1 on the component pickup unit 4. This results in a reactive force F2 from the component pickup unit 4 on the subframe 3, which reactive force F2 is equal in magnitude to the force F1 but opposite in direction thereto. At the same time, the control unit 33 sends the control signal to an auxiliary control unit 34, in which the reactive force F2 to be expected is calculated on the basis of an acceleration-time profile in the control signal and the known moving mass. On the basis of said reactive force F2 to be expected, an electric current is led to the coil 32 by means of the auxiliary control unit 34, which current will generate a counterforce in the drive unit 26 which is equal in magnitude to the reactive force F2 to be expected but which direction is the same direction as the force F1. The forces F1, F2 and the force generated by the drive unit 26 are preferably in line with each other. In this way the forces generated by the drive unit are prevented from introducing a torque. The reactive force F2 exerted on the subframe 3 will be opposed and eliminated by the counterforce generated by the drive unit 26. Since no resulting force is exerted on the subframe 3, no vibrations and deformations will occur in the component placement device 21. Thus the movement of the component pickup unit 4 relative to the subframe 3 will not affect the accuracy with which a component can be placed on a substrate 9 by means of an adjacent component pickup unit 4. In FIG. 2, dotted lines illustrate the deformations experienced by the auxiliary frame 22 as a result of the forces exerted thereon. Since the auxiliary frame 22 is freestanding, said forces will not be transmitted to the machine frame 5, and said deformations and the accompanying vibrations will not affect the placement accuracy of the component pickup unit 4.

FIGS. 4-9 show various views of an embodiment of a component placement device 41 according to the invention, which comprises a machine frame 42, a conveying device 43 for substrates 44, which is supported by the machine frame 42, and three subframes 45, which each comprise two guides 46 disposed side by side. A component pickup unit 47, which conveying device 43 is provided with a nozzle 147, among other parts, by means of which a component can be picked up, is movable over each guide 46. The component placement device 41 comprises, at a front side thereof, a number of component supplying devices 48, which are accommodated in exchangeable holders 49. The component placement device 41 is further provided with an auxiliary frame 50, which comprises two sections 51 positioned under the machine frame, two uprights 52 extending transversely thereto, which are disposed at the rear side of the component placement device 41, and a girder 53 extending between the uprights 52. The sections 51 are connected to the machine frame 55 via legs 54. Because of the relatively large distance between the legs 54 and the component pickup unit 47, such an arrangement of auxiliary frame 50 can nevertheless be regarded as freestanding. Each subframe 45 is provided with permanent magnets 54 near the girder 53, in line with each guide 46, which magnets are disposed between coil blocks 55 connected to the girder 53. The permanent magnets 54 are connected to the subframe 45 via a connecting section 56.

The operation of the drive unit made up of the permanent magnets 54 and the coil blocks 55 is comparable to that of the drive unit 26 described with reference to FIGS. 2, 3A, 3B. Each subframe 45 has two drive units 57 associated therewith, by means of which first and second drive unit 57 a counterforce is generated for eliminating the reactive force from the first and the second component pickup unit 47, respectively, being moved over the first and the second guide 46, respectively.

Figure 8:
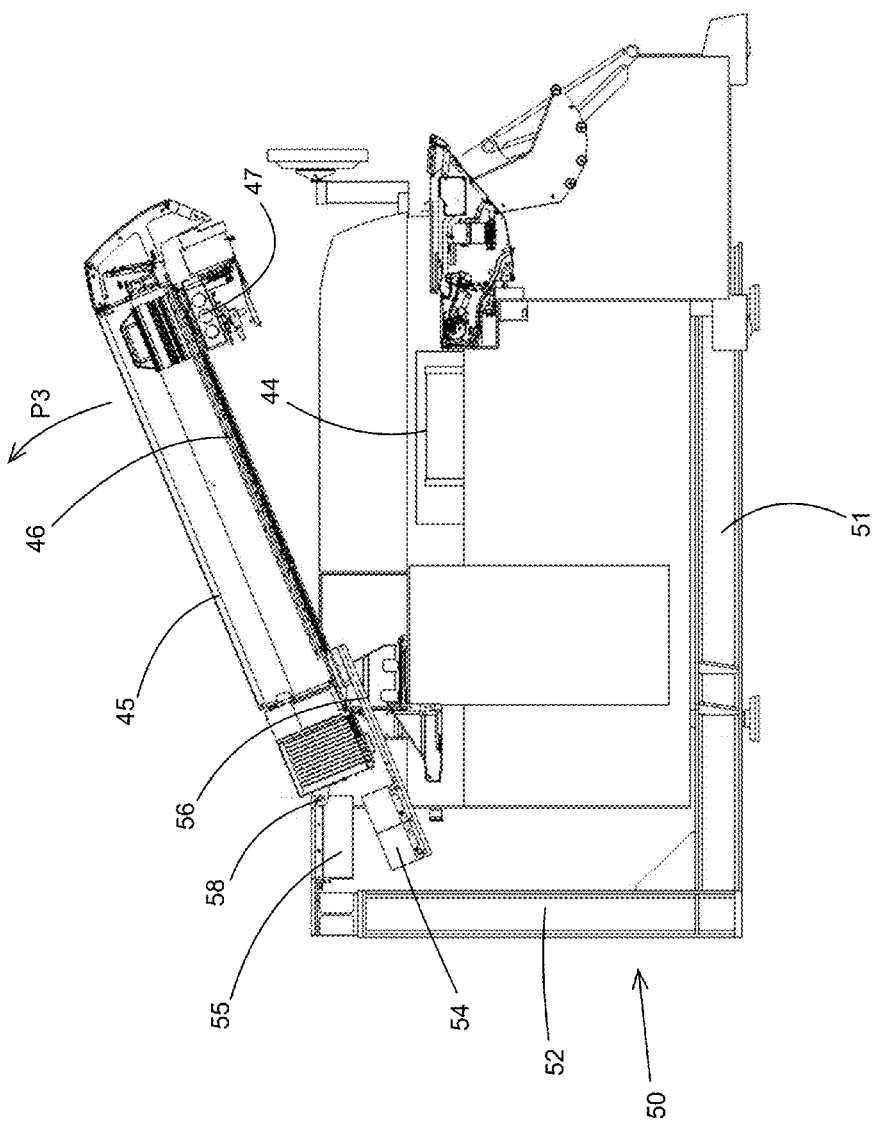
FIG. 8 is a partially cutaway side view of the component placement device shown in FIG. 3, in which the subframe is tilted upwards relative to the machine frame.
Figure 9:
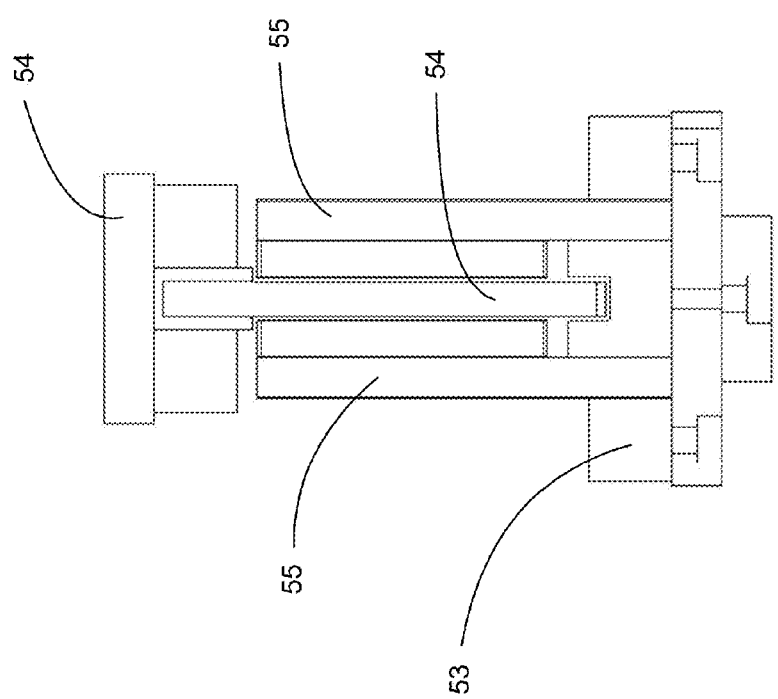
FIG. 9 is a cross-sectional view in the direction indicated by arrows VIII-VIII in FIG. 6 of the drive unit of the component placement device according to the invention. Like parts are indicated by the same numerals in the figures.

In order to make it possible to gain access to the space under the subframes 45, for example for carrying out maintenance work, each subframe 45 can be pivoted in a direction indicated by arrow P3 about a pivot axis 58 located near the girder 53. This pivoted position of the subframe 45 is shown in FIG. 8, in which the permanent magnets 54 are shown to have been swung out from their position between the coil blocks 55.

It is noted that six guides extend parallel to each other in the component placement device 41 shown in FIGS. 4-9, which guides are each provided with a component pickup unit 47. In use, a component is placed on a substrate 9, for example by a first one of the six component pickup units 47, whilst the other five component pickup units 47 are moved at relatively high accelerations. The use of the drive units 57, which exert forces on the subframes 45 for counteracting reactive forces being exerted on the subframes 45 by the moving component pickup units 47, significantly reduces or altogether prevents the occurrence of vibrations and deformations, as a result of which the components can be accurately placed on the substrate by the first component pickup unit 47, in which regard a degree of accuracy of less than 10-15 micron can be realised.

The directions of movement of the various component pickup units 47 may also extend transversely to each other or include a different angle with each other.

If the component pickup unit 47 is also movable in a further direction of movement extending transversely to the direction of movement, it is also possible to provide the component placement device with drive units for generating counterforces in said further direction of movement.

It is also possible to use other combinations of magnets and coils, such as Lorentz actuators, for the drive unit. Also hydraulic drive units are possible.

The invention claimed is:

1. A method for driving a component placement device, the component placement device having a machine frame, first and second component pickup units and a subframe, the first and second component pickup units configured to be movable in at least a direction of movement, the method comprising:

moving at least one of the first and second component pickup unit in the direction of movement relative to the subframe, the first and second component pickup units and the subframe configured for a reactive force to be exerted on the subframe by the moving of the at least one of the first and second component pickup unit;

determining a counterforce to be exerted against the subframe substantially opposite a direction of the reactive force, the counterforce determined by an auxiliary control unit, wherein the counterforce at least partially counteracts the reactive force; and applying the counterforce to the subframe substantially in the opposite direction of the reactive force by at least one drive unit.

2. The method of claim 1, wherein a magnitude of the counterforce to be exerted is determined at least on a basis of a control signal for controlling a movement of the first or second component pickup unit in the direction of movement.

3. The method of claim 1, wherein the reactive force exerted on the subframe by the moving first or second component pickup unit is measured by means of a force sensor, whereupon the magnitude of the counterforce to be exerted is determined at least in dependence on the reactive force being exerted on the subframe and measured by the force sensor.

4. The method of claim 1, wherein the moving comprises accelerating.

5. The method of claim 1, wherein the moving comprises decelerating.

* * * * *